United States Patent
Lee et al.

(10) Patent No.: US 8,630,597 B2
(45) Date of Patent: Jan. 14, 2014

(54) ANTENNA TUNER AND METHOD FOR ADJUSTING ANTENNA IMPEDANCE

(75) Inventors: Jongsoo Lee, Gwangju (KR); Ki Chul Kim, Gwangju (KR)

(73) Assignee: Gwangju Institute of Science and Technology, Buk-gu, Gwangju (KR)

( * ) Notice: Subject to any disclaimer, the term of this patent is extended or adjusted under 35 U.S.C. 154(b) by 14 days.

(21) Appl. No.: 13/326,037

(22) Filed: Dec. 14, 2011

(65) Prior Publication Data
US 2013/0135060 A1 May 30, 2013

(30) Foreign Application Priority Data
Nov. 24, 2011 (KR) .......................... 10-2011-0123463

(51) Int. Cl.
*H01Q 11/12* (2006.01)
*H04B 1/04* (2006.01)

(52) U.S. Cl.
USPC ......................... 455/121; 455/129; 343/822

(58) Field of Classification Search
USPC ......... 455/41.2, 571, 82–83, 575.7, 120–125, 455/129; 343/822; 330/124 R, 107
See application file for complete search history.

(56) References Cited

U.S. PATENT DOCUMENTS

| | | | | |
|---|---|---|---|---|
| 7,865,154 B2 * | 1/2011 | Mendolia et al. | ............. | 455/125 |
| 7,917,104 B2 * | 3/2011 | Manssen et al. | ............. | 455/121 |
| 8,280,323 B2 * | 10/2012 | Thompson | ................... | 455/126 |

* cited by examiner

*Primary Examiner* — Christian Hannon
(74) *Attorney, Agent, or Firm* — Nath, Goldberg & Meyer; Joshua B. Goldberg; Jerald L. Meyer

(57) ABSTRACT

Disclosed are an antenna tuner and a method for adjusting antenna impedance. The antenna tuner includes a reference impedance resistor, a first coupler having an isolated port connected to one end of the reference impedance resistor, a second coupler having an input port connected to an output port of the first coupler and an output port connected to the antenna, and an impedance adjusting device group connected to the second coupler to adjust impedance of the antenna. An impedance controller generates an impedance adjustment control signal according to a first voltage applied to a coupled port of the first coupler, and a second voltage applied to a coupled port of the second coupler to provide the impedance adjustment control signal to the impedance adjusting device group.

11 Claims, 7 Drawing Sheets

ANTENNA TUNER AND METHOD FOR ADJUSTING ANTENNA IMPEDANCE

CROSS-REFERENCE TO RELATED APPLICATION

This application claims the benefit under 35 U.S.C. §119 (a) of Korean Patent Application No. 10-2011-0123463, filed on Nov. 24, 2011 in the Korean Intellectual Property Office, the entirety of which is incorporated herein by reference.

BACKGROUND OF THE INVENTION

1. Field of the Invention

The present invention relates to an antenna tuner. In more particular, the present invention relates to a tuner and a method for adjusting antenna impedance.

2. Description of the Related Art

In general, when a user makes communication in the state that the user grips a mobile phone by a hand, antenna impedance may not be reference impedance of about 50Ω.

In this case, since the mobile phone increases current consumption of a power amplifier in order to transmit predetermined output signals through an antenna, the power consumption of a battery may be increased. In the worst case, the communication may be disconnected.

In order to solve the above problems, schemes to adjust antenna impedance through complex algorithms have been suggested. However, since the complex algorithms are processed by a central process unit (CPU) or a baseband processor provided in the mobile phone, an antenna tuner to adjust antenna impedance cannot be independently realized. Accordingly, actually, the complex algorithms cannot be applied to a product.

SUMMARY OF THE INVENTION

An object of the present invention is to provide a tuner and a method for adjusting antenna impedance through a simple operation.

In order to accomplish the object of the present invention, according to an aspect of the present invention, there is provided a tuner of an antenna including a reference impedance resistor, a first coupler having an isolated port connected to one end of the reference impedance resistor, a second coupler having an input port connected to an output port of the first coupler and an output port connected to the antenna, an impedance adjusting device group connected to the second coupler to adjust impedance of the antenna, and an impedance controller generating an impedance adjustment control signal according to a first voltage, which is proportional to a first power detected in a coupled port of the first coupler, and a second voltage which is proportional to a second power detected in a coupled port of the second coupler, to provide the impedance adjustment control signal to the impedance adjusting device group.

The impedance adjusting device group includes a transmission line, a first switch having one end connected to one end of the transmission line and an opposite end connected to the input port of the second coupler, a second switch having one end connected to an opposite end of the transmission line and an opposite end connected to the output port of the second coupler, a first variable capacitor having one end connected to the one end of the transmission line, and a second variable capacitor having one end connected to the opposite end of the transmission line.

The impedance controller turns on the first and second switches if an absolute value of a difference between the first and second voltages is greater than a first threshold voltage.

The impedance controller generates a control signal to adjust the first and second variable capacitors based on a third voltage, which corresponds to the absolute value of the difference between the first and second voltages, if the third voltage is smaller than a second threshold voltage in a state that the first and second switches are turned on, and applies the control signal to the first and second variable capacitors.

The impedance adjusting device group further includes a third switch having one end connected to the input port of the second coupler, a fourth switch having one end connected to the output port of the second coupler, a third variable capacitor having one end connected to an opposite end of the third switch and an opposite end connected to the coupled port of the second coupler, and a fourth variable capacitor having one end connected to an opposite end of the fourth switch and an opposite end connected to an isolated portion of the second coupler.

The impedance controller turns on the first to fourth switches if an absolute value of a difference between the first and second voltages is greater than a first threshold voltage.

According to another aspect of the present invention, there is provided a method for adjusting antenna impedance by an antenna tuner, which includes a reference impedance resistor, a first coupler having an isolated port connected to one end of the reference impedance resistor, a second coupler having an input port connected to an output port of the first coupler and an output port connected to the antenna, and an impedance adjusting device group connected to the second coupler to adjust impedance of an antenna. The method includes detecting a first voltage which is proportional to a first power detected in a coupled port of the first coupler, detecting a second voltage which is proportional to a second power detected in a coupled port of the second coupler, generating an impedance adjustment control signal according to the first and second voltages, and providing the impedance adjustment control signal to the impedance adjusting device group.

As described above, according to one embodiment of the present invention, two couplers are connected to each other in series, and antenna impedance is adjusted by comparing voltages generated in coupling ports of the two couplers with each other. Accordingly, the antenna impedance can be more simply adjusted into the range of target impedance.

In addition, according to one embodiment of the present invention, a reference impedance resistor is connected to an isolated port of one coupler, and an impedance adjusting device group is provided to another coupler, so that antenna impedance can be adjusted in the state that the variation of the antenna impedance by external environments is blocked. Accordingly, the antenna impedance can be more simply adjusted into the range of target impedance.

DETAILED DESCRIPTION OF THE INVENTION

Figure 1:
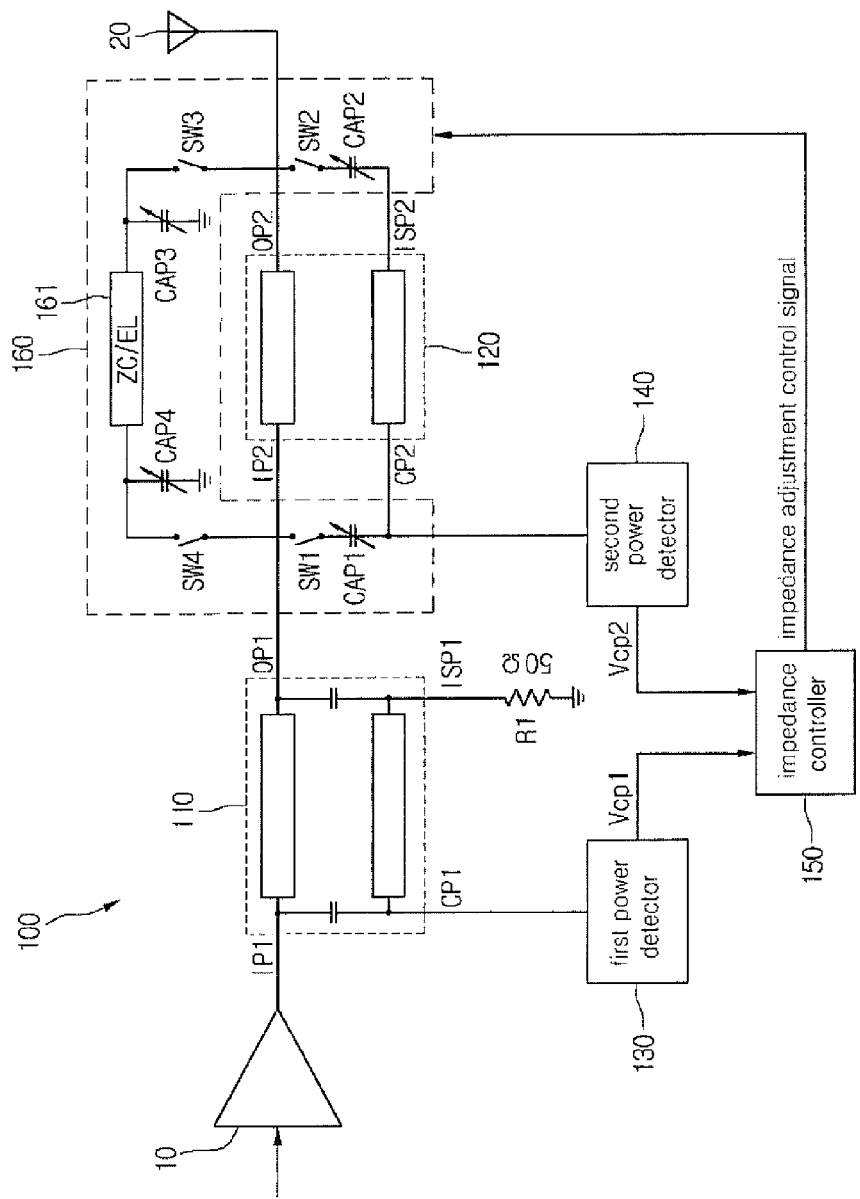
FIG. 1 is a circuit diagram showing an antenna tuner according to the embodiment of the present invention.

Hereinafter, the embodiments of the present invention will be described in detail with reference to accompanying drawings so that the embodiments can be readily realized by those skilled in the art to which the present invention pertains. However, the present invention is not limited to the following embodiments but includes various applications and modifications. In addition, parts that are not related to the present invention are omitted from the accompanying drawings in order to make the present invention clear, and the similar reference numerals will be assigned to the similar components throughout the specification.

In the following description, when a predetermined part "is connected to" another part, this means not only that the predetermined part is directly connected to another part, but also that the predetermined is electrically connected to another part while interposing another component between the predetermined part and another part.

In the following description, when a predetermined part "includes" a predetermined component, the predetermined part does not exclude other components, but may further include other components unless otherwise indicated.

Hereinafter, an antenna tuner 100 will be described with reference to FIG. 1.

FIG. 1 is a circuit diagram showing the antenna tuner 100 according to the embodiment of the present invention.

As shown in FIG. 1, the antenna tuner 100 is interposed between a filter 10 such as a power amplifier or a duplexer and an antenna 20, and includes a first coupler 110, a second coupler 120, a first power detector 130, a second power detector 140, an impedance controller 150, an impedance adjusting device group 160, and a reference impedance resistor R1.

The first and second couplers 110 and 120 may have a coupled line coupler structure based on a coupling effect made by arranging two metallic lines closely to each other on the same plane. The present invention is not limited thereto, but the first and second couplers 110 and 120 may have various coupler structures.

At least one of the first and second couplers 110 and 120 may be realized on a printed circuit board serving as a main board of a mobile phone. In addition, the at least one of the first and second couplers 110 and 120 may be realized in the form of a transmission line on a semiconductor substrate through a micro semiconductor process. In addition, the at least one of the first and second couplers 110 and 120 may be realized in the form of a passive circuit using inductors and capacitors.

All of the first coupler 110, the second coupler 120, the first power detector 130, the second power detector 140, the impedance controller 150, the impedance adjusting device group 160, and the reference impedance resistor RI may be integrated on one semiconductor substrate through the fine semiconductor process. In order to integrate the above components, various semiconductor technologies such as Si CMOS, an SiGe HBT, an SOI CMOS, a GaAs HBT, a GaAs pHEMT, and a GaN HEMT is applicable.

The first coupler 110 has an input port IP1, an output port OP12, a coupled port CP1, and an isolated port ISP1. The input port IP1 of the first coupler 110 is connected to an output terminal of the filter 10 such as the power amplifier or the duplexer.

The reference impedance resistor R1 has one end connected to the isolated port ISP1 of the first coupler 110 and an opposite end which is grounded.

The second coupler 120 has an input port IP2, an output port OP2, a coupled port CP2, and an isolated port ISP2. The input port IP2 of the second coupler 120 is connected to the output port OP1 of the first coupler 110. The output port OP2 of the second coupler 120 is connected to the antenna 20.

The first power detector 130 generates a first voltage Vcp1 proportional to a power of the output port OP1 of the first coupler 110 detected through the coupled port CP1 of the first coupler 110.

The second power detector 140 generates a second voltage Vcp2 proportional to a power of the output port OP2 of the second coupler 120 detected through the coupled port CP2 of the second coupler 120.

Since the voltages Vcp1 and Vcp2 generated from the first and second power detectors 130 and 140, respectively, are proportional to the powers applied from the coupled ports CP1 and CP2, it is assumed that the voltage and the power are used in the same concept for the purpose of explanation.

The impedance controller 150 generates an impedance adjustment control signal by using the voltage Vcp1 generated from the first power detector 130 and the voltage Vcp2 generated from the second power detector 140 and provides the impedance adjustment control signal to the impedance adjusting device group 160.

The impedance adjusting device group 160 adjusts antenna impedance according to the impedance adjustment control signal.

The impedance adjusting device group 160 according to the embodiment of the present invention includes a first switch SW1, a second switch SW2, a third switch SW3, a fourth switch SW4, a first variable capacitor CAP1, a second variable capacitor CAP2, a third variable capacitor CAP3, a fourth variable capacitor CAP4, and a transmission line 161. The transmission line 161 has a characteristic impedance ZC and an electrical length EL. The first switch SW1 has one end connected to the input port IP2 and an opposite end connected to one end of the first variable capacitor CAP1. An opposite end of the first variable capacitor CAP1 is connected to the coupled port CP2.

The second switch SW2 has one end connected to the output port OP2 and an opposite end connected to the second variable capacitor CAP2. An opposite end of the second variable capacitor CAP2 is connected to the isolated port ISP2.

The third switch SW3 has one end connected to the output port OP2 and an opposite end connected to one end of the transmission line 161. The third variable capacitor CAP3 has one end connected to the opposite end of the third switch SW3 and an opposite end that is grounded.

The fourth switch SW4 has one end connected to the input port IP2 and an opposite end connected to an opposite end of the transmission line 161. The fourth variable capacitor CAP4 has one end connected to the opposite end of the fourth switch SW4, and an opposite end which is grounded.

The impedance adjusting device group 160 may be realized in various structures. In particular, according to one embodiment, the first and second switches SW1 and SW2, and the first and second variable capacitors CAP1 and CAP2 may be omitted. According to another embodiment, the third and fourth switches SW3 and SW4 and the third and fourth variable capacitors CAP3 and CAP4 may be omitted. In other words, various combinations of switches and capacitors can be used according to the characteristics of a manufactured coupler.

Hereinafter, a method for adjusting the antenna impedance according to the embodiment of the present invention will be described with reference to FIG. 2.

Figure 2:
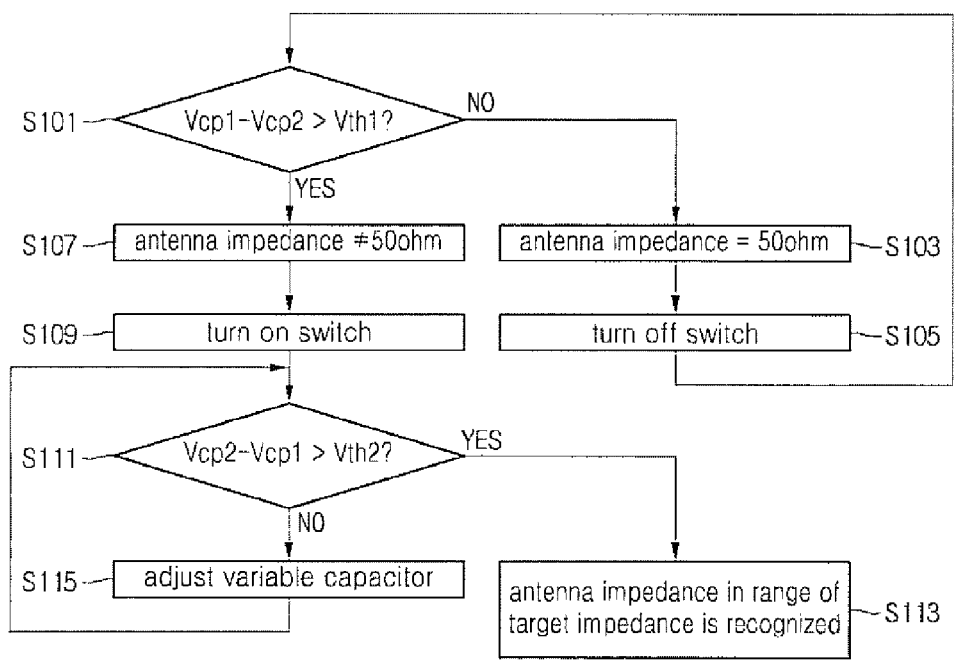
FIG. 2 is a flowchart showing a method for adjusting antenna impedance according to the embodiment of the present invention.

FIG. 2 is a flowchart showing the method for adjusting antenna impedance according to the embodiment of the present invention.

First, the impedance controller 150 determines if the difference between the voltage Vcp1 generated from the first power detector 130 and the voltage Vcp2 generated from the second power detector 140 is greater than a first threshold voltage Vth1 (step S101), In general, the directivity of a coupler is defined as shown in following Equation 1.

$$\text{Directivity} = (\text{power of coupled port}) - (\text{power of isolated power}).\quad \text{Equation 1}$$

In Equation 1, that the directivity of the coupler is high refers to that variation in power of the coupled port is very small even if the impedance variation of the output port is greatly represented. In contrast, that the directivity of the coupler is low refers to that the variation in the power of the couple port is great if the impedance variation of the output port is great.

In general, the coupler representing high directivity has the directivity of about 20 dB or more, and the isolated port of the coupler is connected to a resistor having reference impedance of about 50 Ω.

Since the reference impedance resistor R1 having reference resistance is connected to the isolated port ISP1 of the first coupler 110, the first coupler 110 represents the superior directivity. Therefore, even if the antenna impedance varies, the power detected in the coupled port CP1 of the first coupler 110 and the voltage Vcp1 generated based on the power are mostly constant.

However, since the reference impedance resistor R1 having the reference impedance is not connected to the isolated port ISP2 of the second coupler 120, the second coupler 120 represents inferior directivity. Accordingly, if the antenna impedance varies, the variation in the power detected at the coupled port CP2 of the second coupler 120 and the voltage Vcp2 generated based on the power is greatly represented.

The impedance controller 150 can detect the variation of the antenna impedance by using the difference between the voltage Vcp1 generated from the first power detector 130 and the voltage Vcp2 generated from the second power detector 140. In other words, the impedance controller 150 can detect that the antenna impedance is not 50Ω, based on the variation of the voltages Vcp1 and Vcp2. Therefore, the variation of the antenna impedance can be reduced by using the two voltages Vcp1 and Vcp2.

If the difference between the voltages Vcp1 and Vcp2 is smaller than the first threshold voltage Vth1, the impedance controller 150 recognizes that the antenna impedance is 50Ω (step S103), and maintains the first to fourth switches SW1 to SW4 in a turn-off state (step S105).

Figure 3:
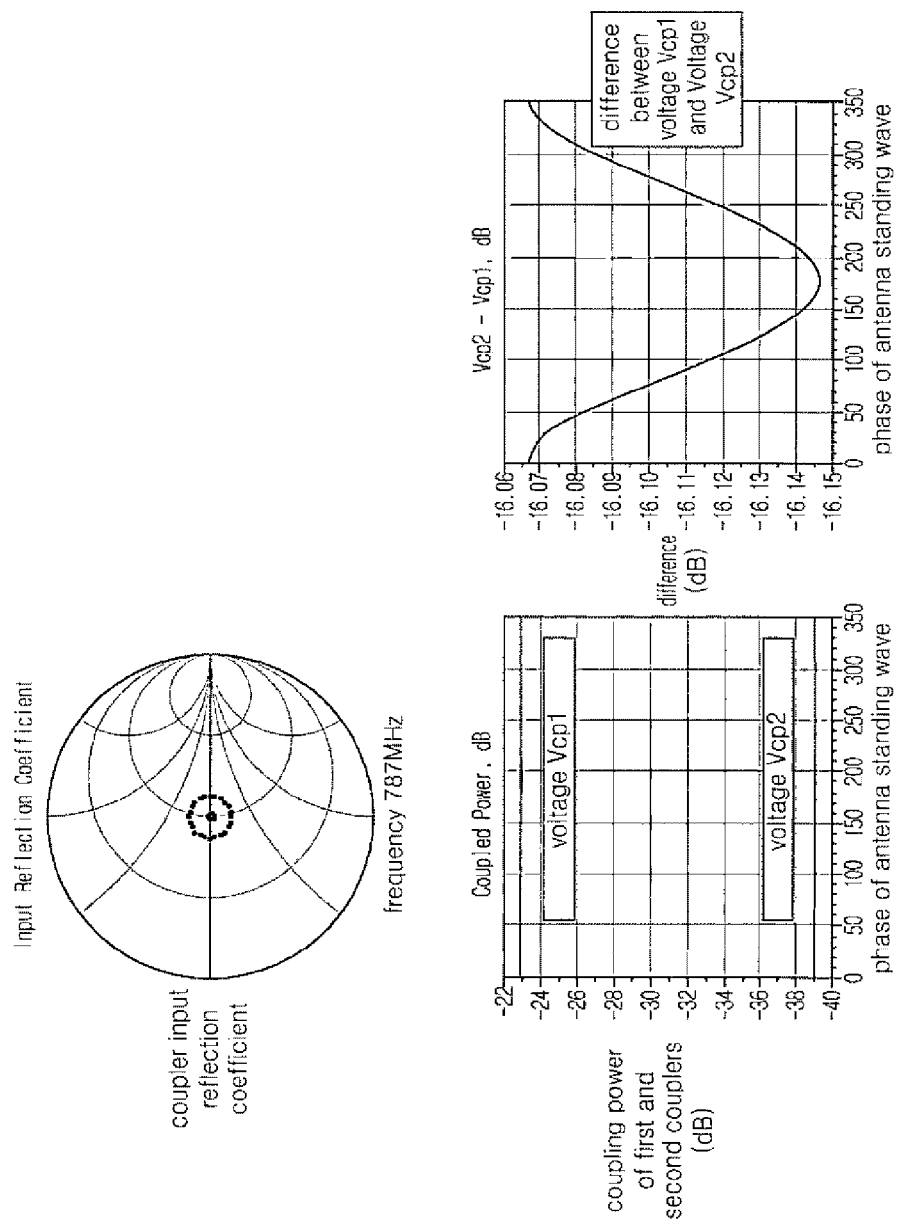
FIG. 3 illustrates the state of the antenna tuner when antenna impedance corresponds to reference impedance according to the embodiment of the present invention.

FIG. 3 illustrates the state of the antenna tuner when antenna impedance corresponds to reference impedance according to the embodiment of the present invention. As shown in FIG. 3, if the antenna impedance is 50Ω, the voltage Vcp1 generated from the first power detector 130 and the voltage Vcp2 generated from the second power detector 140 are constantly maintained as preset voltages. As shown in FIG. 3, the power detected in the coupled port CP1 of the first coupler 110 is about −23 dB, and the voltage Vcp1 proportional to the power is constant. In addition, the power detected in the coupled port CP2 of the second coupler 120 is about −39 dB, and the voltage Vcp2 proportional to the power is constant. Therefore, the difference between the voltage Vcp1 and the voltage Vcp2 is constant as about −16 dB.

Referring to FIG. 2 again, if the variation of the antenna impedance is greatly represented, the variation of the power detected in the coupled port CP2 of the second coupler 120 is greatly represented. Accordingly, if the difference between the voltage Vcp1 and the voltage Vcp2 is greater than the first threshold voltage Vth1, the impedance controller 150 can recognize that the antenna impedance is not 50Ω (step S107).

Figure 4:
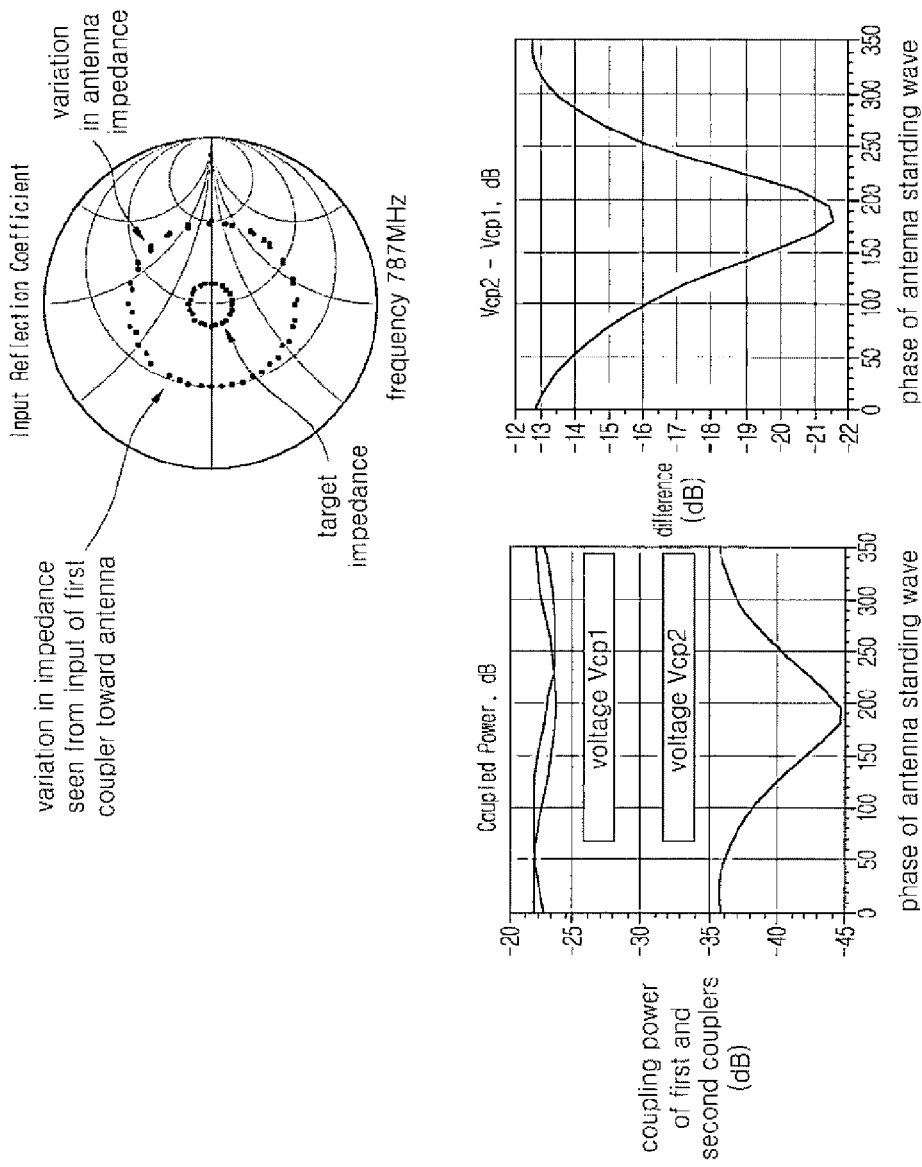
FIG. 4 illustrates the state of the antenna tuner when antenna impedance varies and all switches are turned off so that a VSWR (voltage standing wave ratio) is 3:1 according to the embodiment of the present invention.

FIG. 4 illustrates the state of the antenna tuner 100 when antenna impedance varies and all switches are turned off so that a voltage standing wave ratio is 3:1 according to the embodiment of the present invention.

As shown in FIG. 4, if the antenna impedance varies, the voltage Vcp1 is constant, but the voltage Vcp2 significantly varies. In other words, as shown in FIG. 4, the voltage Vcp1 of the coupled port CP1 of the first coupler 110 has a value of about −23 dB, but the voltage Vcp2 of the coupled port CP2 of the second coupler 120 has a value in the range of about −36 dB to about −45 dB. Therefore, the difference between the voltage Vcp1 and the Vcp2 may have a value in the range of −12.5 dB to about −21.5 dB. Therefore, if the absolute value of the difference between the voltage Vcp1 and the voltage Vcp2 is greater than the first threshold value Vth1, the impedance controller 150 can recognize that the antenna impedance is not 50Ω.

If the impedance controller 150 recognizes that the antenna impedance is not 50Ω, the impedance controller 150 turns on the first to fourth switches SW1 to SW2 (step S109).

If the first to fourth switches SW1 to SW4 are turned on, the magnitude of the voltage Vcp2 becomes greater than the magnitude of the voltage Vcp1. However, even if the antenna impedance varies by elements, such as the transmission line 161 (ZC/EL), the third variable capacitor CAP3, and the fourth variable capacitor CAP4, which are connected in parallel to the second coupler 1, the impedance seen from the input of the first coupler 110 toward the antenna 20 is constant. Therefore, the impedance controller 150 can make antenna impedance in the range of target impedance by adjusting parts of the four variable capacitors CAP1, CAP2, CAP3, and CAP4 and all of the four variable capacitors CAP1, CAP2, CAP3, and CAP4.

The impedance controller 150 determines if the absolute value of the difference between the voltages Vcp2 and the Vcp1 is greater than the second threshold voltage Vth2 (step S111).

If the absolute value of the difference between the voltage Vcp2 and the voltage Vcp1 is greater than the second threshold voltage Vth2, the impedance controller 150 recognizes that the antenna impedance is in the range of the target impedance (step S113).

Meanwhile, if the absolute value of the difference between the voltage Vcp2 and the voltage Vcp1 is smaller than the second threshold voltage Vth2, the impedance controller 150 can make antenna impedance in the range of target impedance by adjusting parts of the four variable capacitors CAP1, CAP2, CAP3, and CAP4 and all of the four variable capacitors CAP1, CAP2, CAP3, and CAP4 (step S115). In particular, the impedance controller 150 can adjust the antenna impedance by generating adjustment voltages for a part or all of the four variable capacitors CAP1, CAP2, CAP3, and CAP4 using the difference between the voltages Vcp1 and Vcp2 and providing the voltages to the variable capacitors CAP1, CAP2, CAP3, and CAP4.

Figure 5:
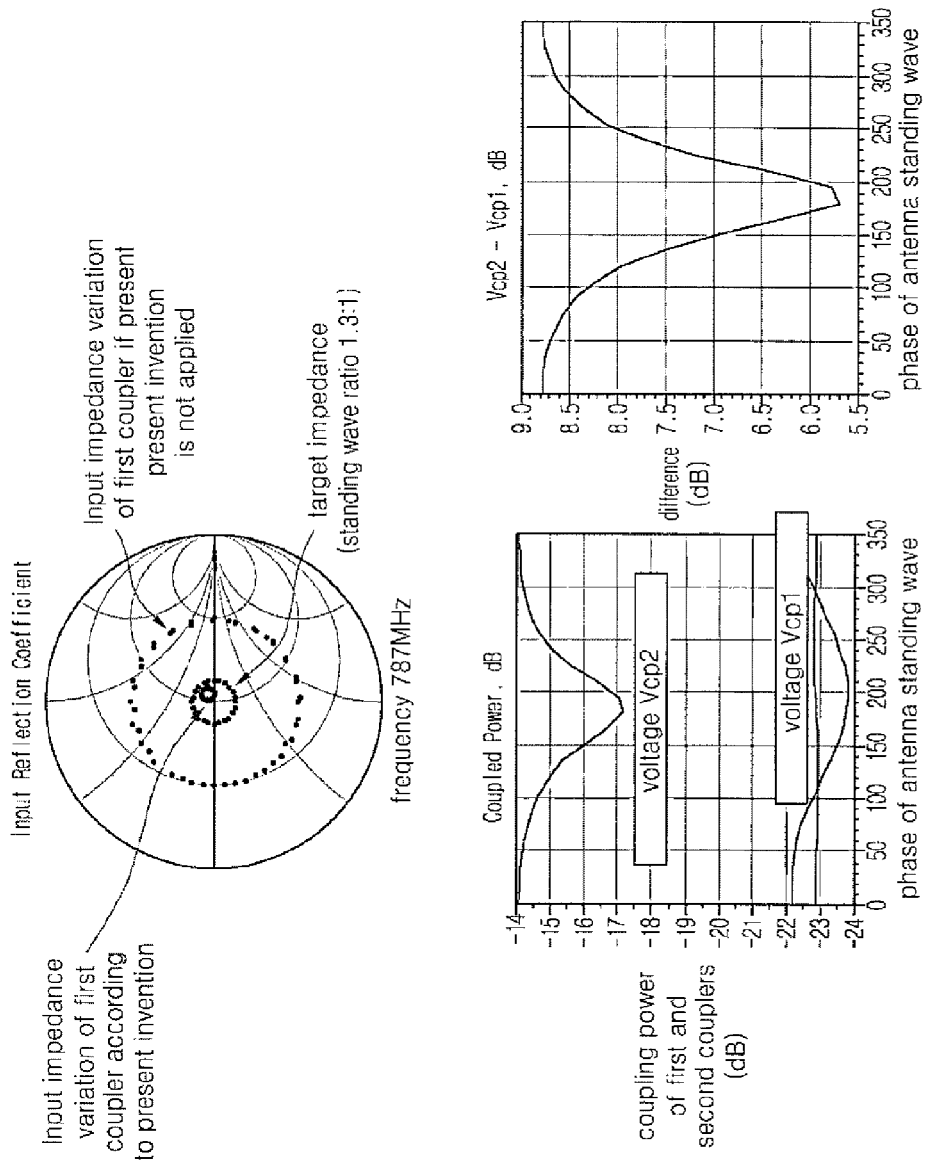
FIG. 5 illustrates the state of the antenna tuner at a frequency of 787 MHz when antenna impedance varies and all switches are turned on so that the VSWR is 3:1 according to the embodiment of the present invention.

FIG. 5 illustrates the state of an antenna tuner at a frequency of 787 MHz when antenna impedance varies and all switches are turned on so that the voltage standing wave ratio is 3:1 according to the embodiment of the present invention.

As shown in FIG. 5, the difference between the voltage Vcp1 and the voltage Vcp2 has a value in the range of about 5.7 dB to about 8.8 dB, so that the antenna impedance exists in the range of target impedance.

Figure 6:
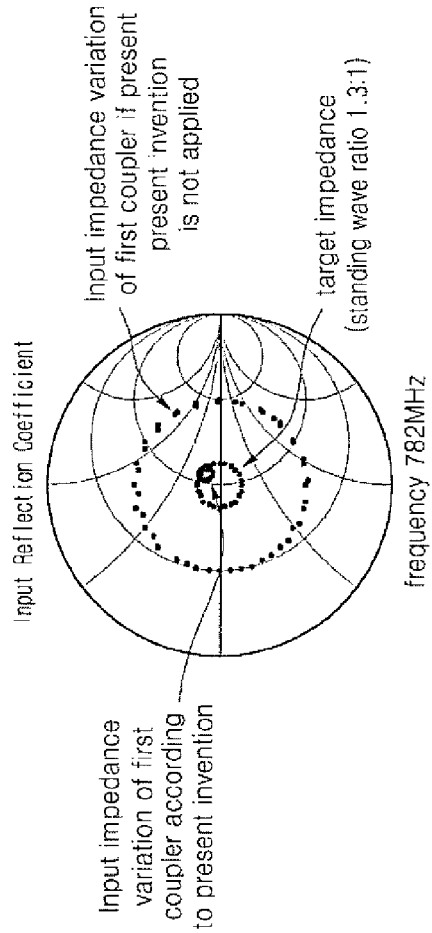
FIG. 6 illustrates the state of the antenna tuner at a frequency of 782 MHz when antenna impedance varies and all switches are turned on so that the VSWR is 3:1 according to the embodiment of the present invention.
Figure 6:
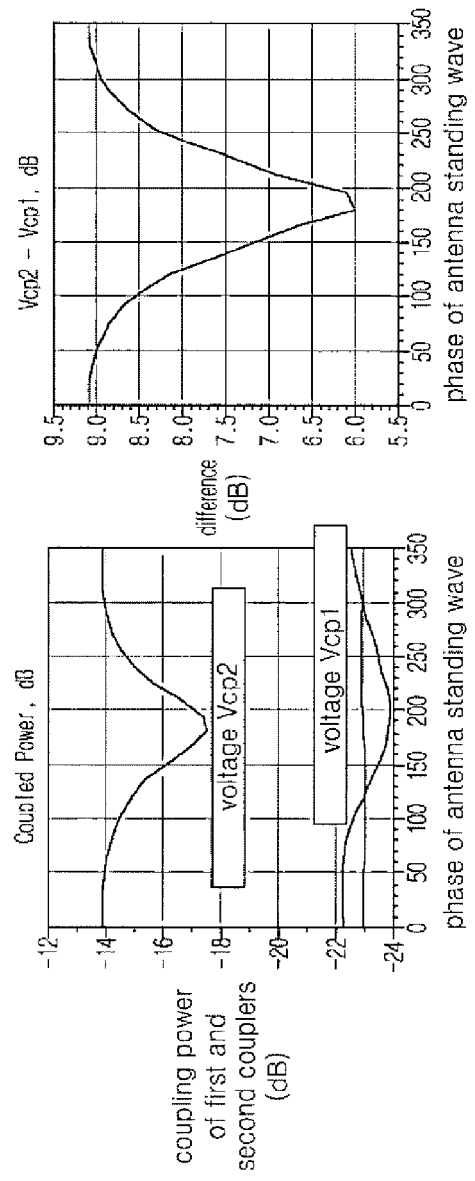

FIG. 6 illustrates the state of an antenna tuner at a frequency of 782 MHz when antenna impedance varies and all switches are turned on so that the voltage standing wave ratio is 3:1 according to the embodiment of the present invention.

As shown in FIG. 6, the difference between the voltage Vcp1 and the voltage Vcp2 has a value in the range of about 6.0 dB to about 9.1 dB, so that the antenna impedance exists in the range of the target impedance.

Figure 7:
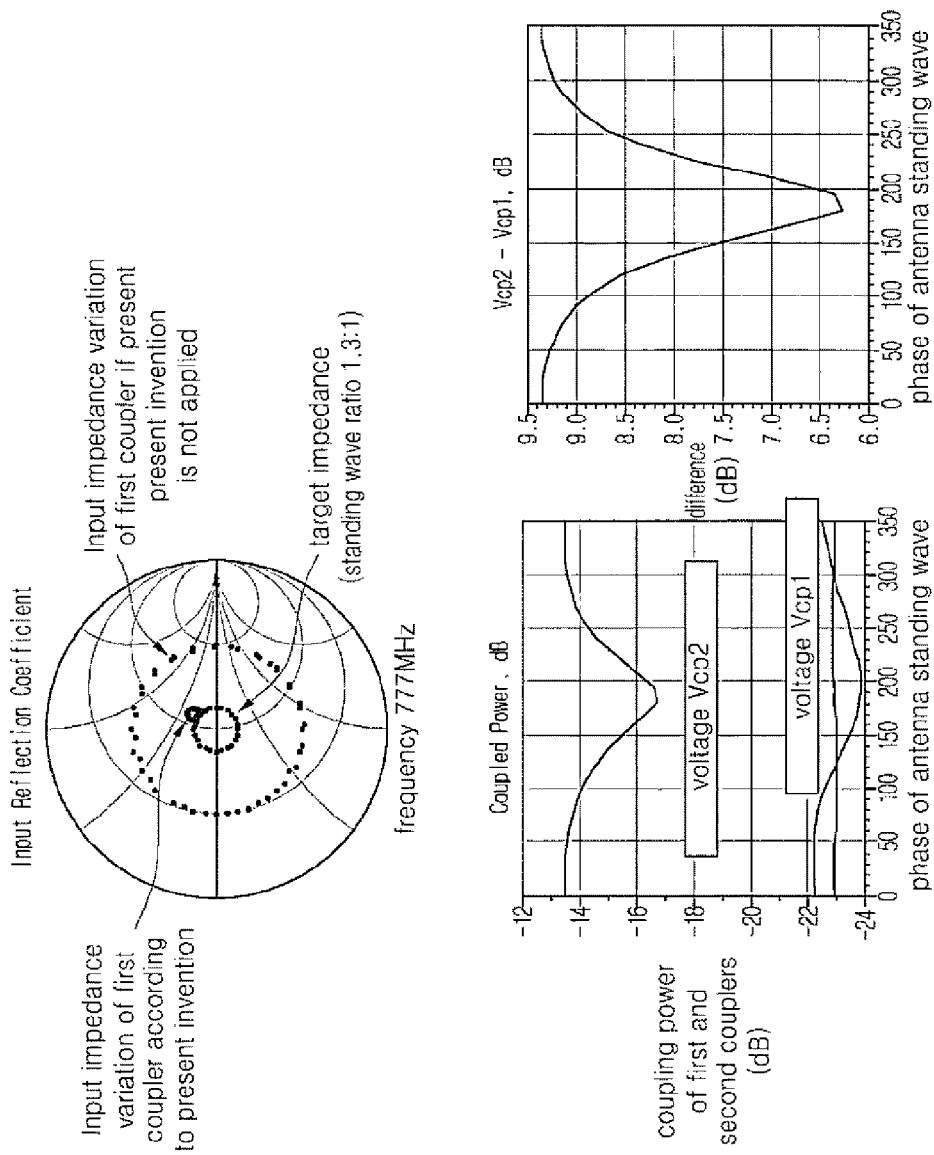
FIG. 7 illustrates the state of the antenna tuner at a frequency of 777 MHz when antenna impedance varies and all switches are turned on so that the VSWR is 3:1 according to the embodiment of the present invention.

FIG. 7 illustrates the state of an antenna tuner at a frequency of 777 MHz when antenna impedance varies and all switches are turned on so that the voltage standing wave ratio is 3:1 according to the embodiment of the present invention.

As shown in FIG. 7, the difference between the voltage Vcp1 and the voltage Vcp2 has a value in the range of about 6.3 dB to about 9.3 dB, so that the antenna impedance exists in the range of the target impedance.

The above embodiments according to the present invention can be realized not only through an apparatus and a method, but also through a program to perform functions corresponding to the components of the embodiment according to the present invention and a recording medium having the program recorded therein. Those skilled in the art to which the present invention pertains can readily perform the realization based on the subject matter of the embodiment by those skilled in the art to which the present invention pertains.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A tuner of an antenna comprising:
a reference impedance resistor;
a first coupler having an isolated port connected to one end of the reference impedance resistor;
a second coupler having an input port connected to an output port of the first coupler and an output port connected to the antenna;
an impedance adjusting device group connected to the second coupler to adjust impedance of the antenna; and
an impedance controller generating an impedance adjustment control signal according to a first voltage, which is proportional to a first power detected in a coupled port of the first coupler, and a second voltage which is proportional to a second power detected in a coupled port of the second coupler, to provide the impedance adjustment control signal to the impedance adjusting device group.

2. The tuner of claim 1, wherein the impedance adjusting device group comprises:
a transmission line;
a first switch having one end connected to one end of the transmission line and an opposite end connected to the input port of the second coupler;
a second switch having one end connected to an opposite end of the transmission line and an opposite end connected to the output port of the second coupler;
a first variable capacitor having one end connected to the one end of the transmission line; and
a second variable capacitor having one end connected to the opposite end of the transmission line.

3. The tuner of claim 2, wherein the impedance controller turns on the first and second switches if an absolute value of a difference between the first and second voltages is greater than a first threshold voltage.

4. The tuner of claim 3, wherein the impedance controller generates a control signal to adjust the first and second variable capacitors based on a third voltage, which corresponds to the absolute value of the difference between the first and second voltages, if the third voltage is smaller than a second threshold voltage in a state that the first and second switches are turned on, and applies the control signal to the first and second variable capacitors. 15

5. The tuner of claim 2, wherein the impedance adjusting device group further comprises:
a third switch having one end connected to the input port of the second coupler;
a fourth switch having one end connected to the output port of the second coupler;
a third variable capacitor having one end connected to an opposite end of the third switch and an opposite end connected to the coupled port of the second coupler; and
a fourth variable capacitor having one end connected to an opposite end of the fourth switch and an opposite end connected to an isolated portion of the second coupler.

6. The tuner of claim 5, wherein the impedance controller turns on the first to fourth switches if an absolute value of a difference between the first and second voltages is greater than a first threshold voltage.

7. A method for adjusting antenna impedance by an antenna tuner including a reference impedance resistor, a first coupler having an isolated port connected to one end of the reference impedance resistor, a second coupler having an input port connected to an output port of the first coupler and an output port connected to the antenna, and an impedance adjusting device group connected to the second coupler to adjust impedance of an antenna, the method comprising:
detecting a first voltage which is proportional to a first power detected in a coupled port of the first coupler;
detecting a second voltage which is proportional to a second power detected in a coupled port of the second coupler;
generating an impedance adjustment control signal according to the first and second voltages; and
providing the impedance adjustment control signal to the impedance adjusting device group.

8. The method of claim 7, wherein the impedance adjusting device comprises:
a transmission line;
a first switch having one end connected to one end of the transmission line and an opposite end connected to the input port of the second coupler;
a second switch having one end connected to an opposite end of the transmission line and an opposite end connected to the output port of the second coupler;
a first variable capacitor having one end connected to the one end of the transmission line; and a second variable capacitor having one end connected to the opposite end of the transmission line.

9. The method of claim 8, wherein, in the providing of the impedance adjustment control signal to the impedance adjusting device group, the first and second switches are turned on if an absolute value of a difference between the first and second voltages is greater than a first threshold voltage.

10. The method of claim 8, wherein the impedance adjusting device group further comprises:
   a third switch having one end connected to the input port of the second coupler;
   a fourth switch having one end connected to the output port of the second coupler;
   a third variable capacitor having one end connected to an opposite end of the third switch and an opposite end connected to the coupled port of the second coupler; and
   a fourth variable capacitor having one end connected to an opposite end of the fourth switch and an opposite end connected to an isolated portion of the second coupler.

11. The method of claim 10, wherein, in the providing of the impedance adjustment control signal to the impedance adjusting device group, the first to fourth switches are turned on if an absolute value of a difference between the first and second voltage is greater than a first threshold voltage.

\* \* \* \* \*